United States Patent [19]
Yoeli

[11] Patent Number: 5,138,194
[45] Date of Patent: Aug. 11, 1992

[54] CONTROLLED SLEW RATE BUFFER

[75] Inventor: Uzi Yoeli, Haifa, Israel

[73] Assignee: Quick Technologies Ltd., Haifa, Israel

[21] Appl. No.: 610,852

[22] Filed: Nov. 8, 1990

[30] Foreign Application Priority Data

Sep. 4, 1990 [IL] Israel .......................... 95576

[51] Int. Cl.[5] ............................... H03K 17/16
[52] U.S. Cl. .................... 307/443; 307/542.1;
307/542; 307/448; 307/451; 307/452; 307/263;
307/475
[58] Field of Search ............ 307/542.1, 542, 448,
307/451, 452, 453, 585, 475, 443, 263

[56] References Cited

U.S. PATENT DOCUMENTS

| | | | |
|---|---|---|---|
| 4,110,704 | 8/1978 | Irwin et al. | 331/111 |
| 4,408,137 | 10/1983 | Fox | 307/471 |
| 4,638,187 | 1/1987 | Boler et al. | 307/270 |
| 4,731,553 | 3/1988 | Van Lehn et al. | 307/443 |
| 4,779,013 | 10/1988 | Tanaka | 307/448 |
| 4,806,802 | 2/1989 | Okitaka et al. | 307/443 |
| 4,862,018 | 8/1989 | Taylor et al. | |
| 4,959,561 | 9/1990 | McDermott et al. | 307/451 |

FOREIGN PATENT DOCUMENTS

0189571 8/1986 European Pat. Off.

OTHER PUBLICATIONS

Leung, Kam, "Controlled Slew Rate Output Buffer", IEEE 1988 IEEE 1988 Custom Integrated Circuits Conference 5.5.1–5.5.4.

*Primary Examiner*—Stanley D. Miller
*Assistant Examiner*—Scott A. Ouellette
*Attorney, Agent, or Firm*—Ladas & Parry

[57] ABSTRACT

A controlled slew rate buffer is disclosed which comprises a driver receiving voltage along a voltage supply line and includes feedback apparatus which senses the noise level along the voltage supply line and slows the speed of the buffer when the noise level passes a given threshold. The driver comprises at least one of (1) first and second VSS voltage sources and (2) first and second VDD voltage sources.

14 Claims, 3 Drawing Sheets

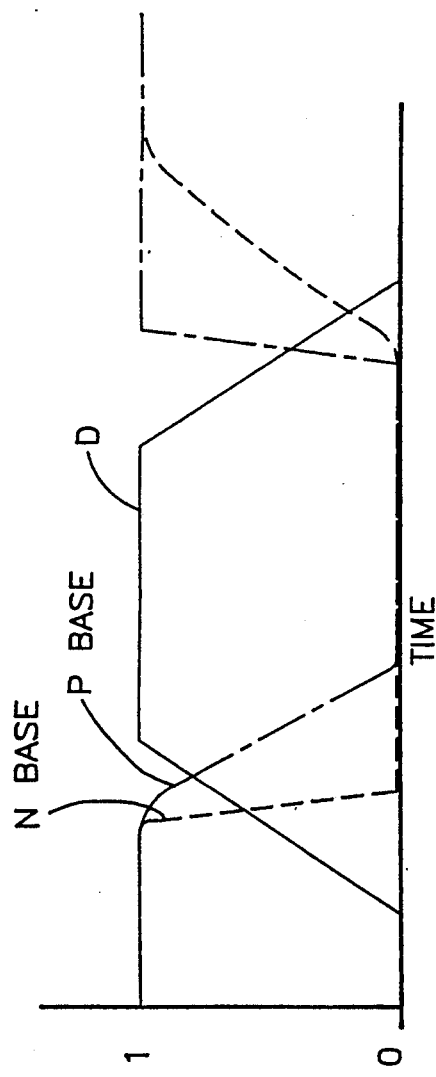
FIG.6
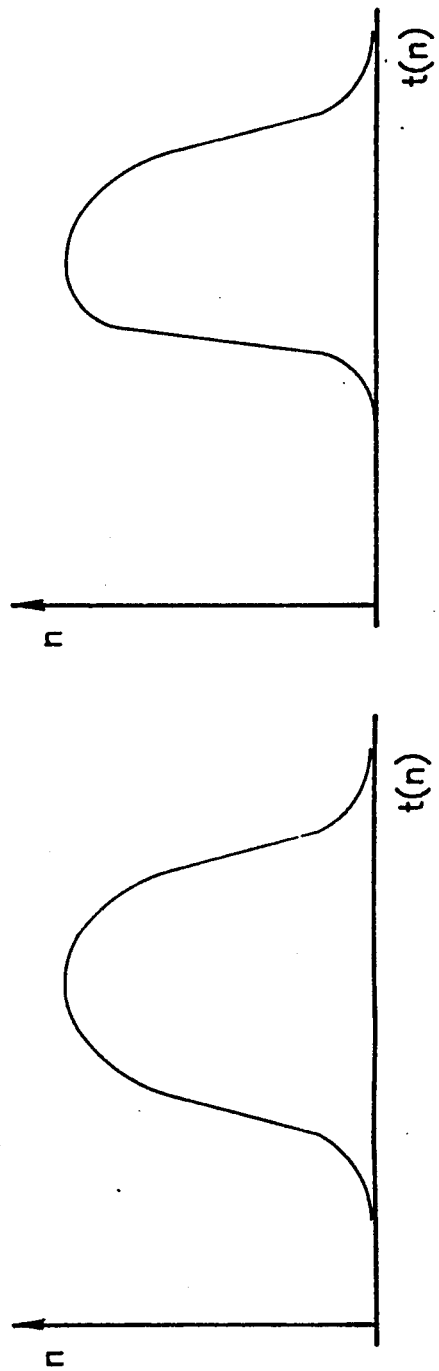
FIG.5B
FIG.5A

CONTROLLED SLEW RATE BUFFER

FIELD OF THE INVENTION

The present invention relates to CMOS integrated circuits generally and more particularly to controlled slew rate output buffers.

BACKGROUND OF THE INVENTION

In conventional CMOS integrated circuits noise is produced by the switching of high speed output signals with external inductances and capacitance loads. This noise is detrimental for circuit performance and operation and may result in crosstalk and output ringing.

A controlled slew rate output buffer is proposed in a publication entitled "Controlled Slew Rate Output Buffer" by Kam Leung, IEEE 1988 Custom Integrated Circuits Conference 5.5.1–5.5.4.

SUMMARY OF THE INVENTION

The present invention seeks to provide an improved controlled slew rate buffer.

There is thus provided in accordance with an embodiment of the present invention a controlled slew rate buffer including a driver receiving voltage along a voltage supply line, and including feedback apparatus which senses the noise level along the voltage supply line and slows the speed of the buffer when the noise level passes a given threshold.

Additionally in accordance with an embodiment of the present invention, there is provided a controlled slew rate buffer comprising a driver receiving voltage along a voltage supply line, the driver comprising first and second VSS voltage supply lines and first and second VDD voltage supply lines and including feedback apparatus which senses voltage differences between at least one of the first and second voltage supply lines and slows the speed of the buffer in response to said voltage differences.

In accordance with a preferred embodiment of the invention, the driver comprises first and second VSS voltage supply lines and first and second VDD voltage supply lines, the first and second VSS and VDD voltage supply lines having separated inductances, typically by having separate supply pads.

Preferably the driver includes first and second transistors of the same type, the first transistor receiving an input from a first voltage supply and having an output connected to a pad and the second transistor receiving an input from a second voltage supply and having its gate connected to the first voltage source and its output connected to the gate of the first transistor. The first and second transistors may be of the N type or the P type. Preferably first and second transistors of the N type are provided and interconnected as above and additionally first and second transistors of the P type are provided and interconnected as above.

When P type transistors are employed, the feedback circuitry controls the rate at which the buffer output rises and when N type transistors are employed, the feedback circuitry controls the rate at which the buffer output drops.

The buffer is preferably formed of CMOS components.

Preferably the driver includes first and second N transistors and first and second P transistors, the first N transistor receiving an input from a first VSS voltage supply and the first P transistor receiving an input from a first VDD voltage supply, the first N and first P transistors having a joined output, the first N transistor having an "N base" input and the first P transistor having a "P base" input, the second N transistor receiving an input from a second VSS voltage supply and the second P transistor receiving an input from a second VDD voltage supply, the base of the second N transistor being coupled to the first VSS voltage supply and the base of the second P transistor being connected to the first VDD voltage supply, the output of the second N transistor being connected to the N base input and the output of the second P transistor being connected to the P base input.

In accordance with an embodiment of the invention there is provided a controlled slew rate buffer comprising a pre-driver and a driver, the pre-driver comprising a split inverter and a non-linear resistor disposed between the two parts of the inverter.

Additionally in accordance with an embodiment of the invention there is provided a controlled slew rate buffer comprising apparatus for providing "break before make" switching of the buffer output.

Further in accordance with a preferred embodiment of the invention, the pre-driver comprises a P transistor and an N transistor having respective outputs which provide respective N base and P base inputs to the driver, the outputs of the P and N transistors being separated by a non-linear transistor.

Normally the P and N transistors receive a D input at their respective bases.

BRIEF DESCRIPTION OF THE DRAWINGS

The invention will be understood and appreciated more fully from the following detailed description, taken in conjunction with the drawings in which:

FIGS. 5A and 5B are diagrammatic illustrations of the speed distribution of circuitry respectively according to the prior art and according to the present invention; and FIG. 6 is a collection of diagrammatic illustrations of the output responses of the circuitry of FIGS. 3 and 4.

DETAILED DESCRIPTION OF A PREFERRED EMBODIMENT

Figure 1:
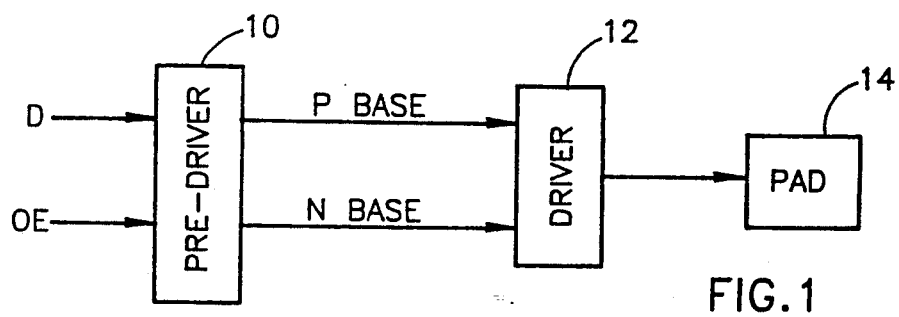
FIG. 1 is a generalized block diagram of buffer circuitry constructed and operative in accordance with a preferred embodiment of the present invention.

Reference is now made to FIG. 1, which illustrates a slew rate control buffer constructed and operative in accordance with a preferred embodiment of the invention. The buffer comprises a pre-driver 10, controlled by an external output enable signal OE, for receiving a drive input signal D and for providing N and P base inputs to a driver 12. The driver 12 is operative to provide an output to a pad 14 in response to receipt of the N and P base inputs.

Figure 2:
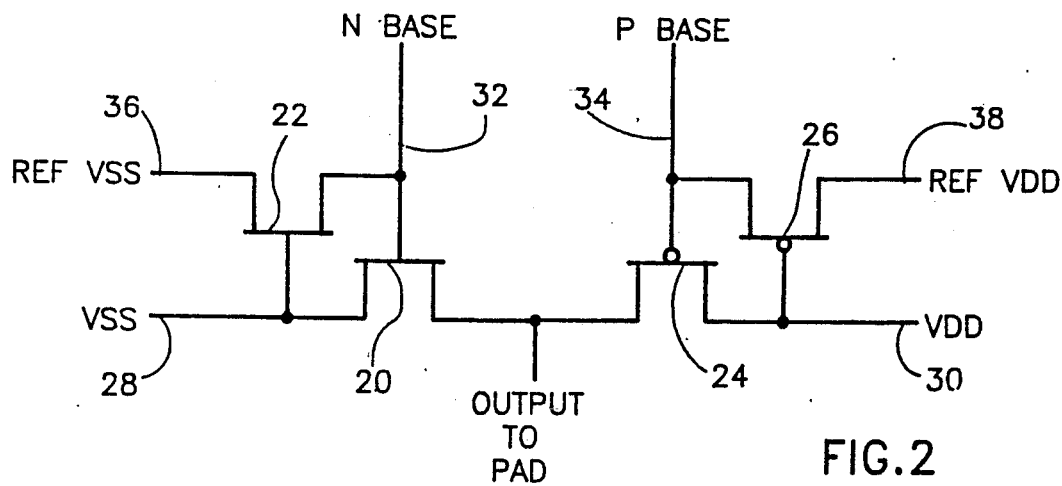
FIG. 2 is a generalized illustration of driver circuitry constructed and operative in accordance with a preferred embodiment of the invention.

Reference is now made to FIG. 2, which is a generalized illustration of a driver 12 incorporating feedback circuitry constructed and operative in accordance with a preferred embodiment of the present invention.

In accordance with a preferred embodiment of the invention, the driver 12 includes first and second N transistors 20 and 22 respectively and first and second P transistors 24 and 26 respectively. The first N transistor 20 receives an input from a first VSS voltage supply along a supply line 28 and the first P transistor 24 receives an input from a first VDD voltage supply along a supply line 30. The first and second VSS and VDD supply lines have separated inductances.

The first N and first P transistors 20 and 24 have a joined output. The first N transistor 20 has an N base input 32 from the pre-driver 10 and the first P transistor 24 has a P base input 34 from the pre-driver 10. The second N transistor 22 receives an input from a second VSS voltage supply along a supply line 36 and the second P transistor 26 receives an input from a second VDD voltage supply along a supply line 38.

The base of the second N transistor 22 is coupled to the supply line 28 and the base of the second P transistor 26 is connected to supply line 30. The output of the second N transistor 22 is connected to the N base input 32 and the output of the second P transistor 26 is connected to the P base input.

Normally, the VDD voltage is a positive voltage, such as +5 Volts, while the VSS voltage is typically 0.

The general operation of the circuitry of FIG. 2 will now be described briefly: When transistor 20 conducts in response to an N input to the base thereof and produces a strong current flow, which is normally accompanied by unacceptably high noise, along supply line 28, a voltage rise occurs along supply line 28, causing transistor 22 to conduct and thereby causing the REF VSS voltage to be applied to the N base input to transistor 20. Since the REF VSS input is essentially 0, this reduces the net input to the base of transistor 20 and causes it to conduct less, thereby slowing the operation of the buffer through the N transistor 20.

Similarly, when transistor 24 conducts in response to a P input to the base thereof and produces a strong current flow along supply line 30, which is normally accompanied by unacceptably high noise, a voltage drop occurs along supply line 30, causing transistor 26 to conduct and thereby causing the REF VDD voltage to be applied to the P base input to transistor 24. Since the REF VDD input is a positive voltage, this increases the net input to the base of P transistor 24 and causes it to conduct less, thereby slowing the operation of the buffer through the P transistor 24.

It is appreciated that the feedback arrangement may be provided in accordance with the present invention in association with either the N or P transistors or in association with both of them, as illustrated in FIG. 2.

Figure 3:
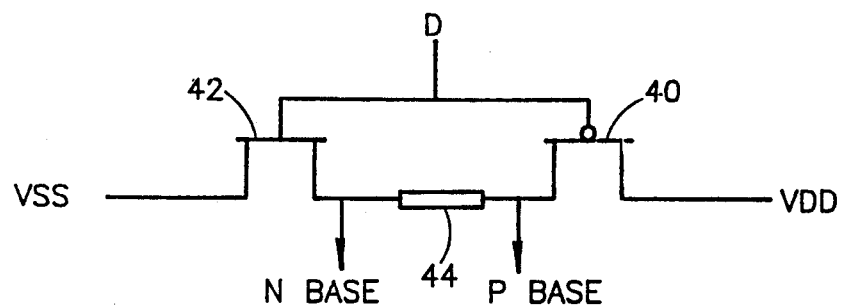
FIG. 3 is a generalized illustration of pre-driver circuitry constructed and operative in accordance with a preferred embodiment of the invention.

Reference is now made to FIGS. 3 and 6 which respectively illustrate a pre-driver constructed and operative in accordance with a preferred embodiment of the invention and its operation. The predriver preferably comprises a P transistor 40 and an N transistor 42, having respective VDD and VSS inputs and having respective outputs which provide respective N and P base inputs to the driver, the outputs of the P and N transistors being separated by a preferably non-linear resistor 44. Normally the P and N transistors 40 and 42 receive a D input at their respective bases.

The operation of the circuitry of FIG. 3 will now be summarized in conjunction with FIG. 6. The intention is to prevent DC current flows through the output transistors of the driver by providing "break before make" switching thereof. When D goes positive, the pre-driver initially drives the N base input to 0 quickly, causing the large N transistor 20 to disconnect, and subsequently drives P to 0, causing the large P transistor 24 to conduct, producing a positive output from the buffer. Similarly, when D goes to 0, the pre-driver first drives the P base input to go positive, causing the large P transistor 24 to disconnect and subsequently drives the N base input to 1, causing the large N transistor 20 to conduct, and cause the output of the buffer to go to 0.

Furthermore, in order to reduce noise, the change in current flow DI/DT is minimized because the N base input is driven positive and the P base input is driven to 0 relatively slowly.

Figure 4:
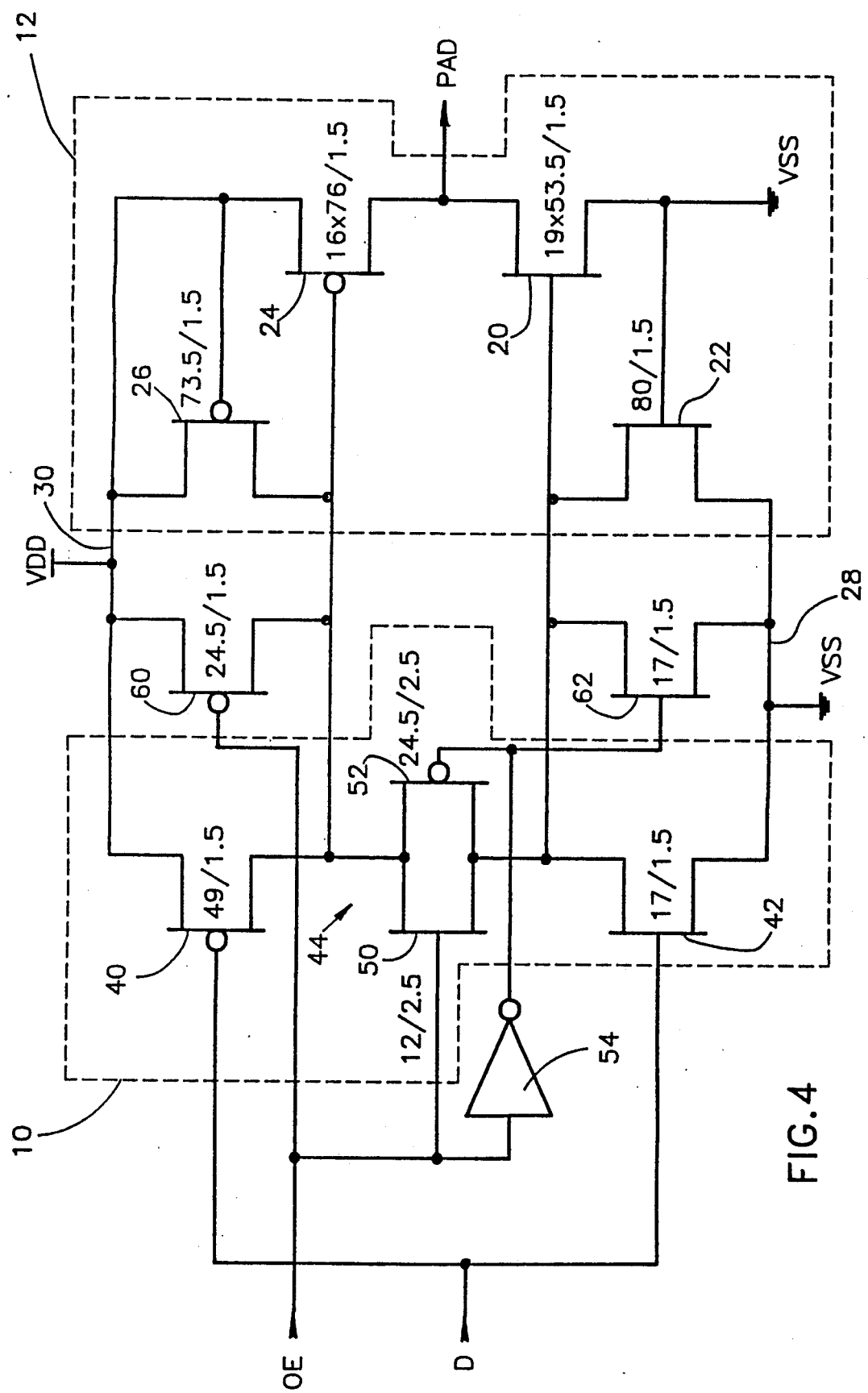
FIG. 4 is a schematic illustration of the circuitry of FIG. 1, constructed and operative in accordance with a preferred embodiment of the invention.

Reference is now made to FIG. 4, which is a schematic illustration of the buffer circuitry of the present invention, incorporating the elements described above in connection with FIGS. 2 and 3. FIG. 4 is an exemplary schematic; the sizes given are by way of example only and are not intended to be limiting. The sizes given in this example are denoted in microns.

The circuitry of FIG. 4 includes a pre-driver portion, indicated generally by reference numeral 10 including P and N transistors 40 and 42 which receive a D input at their bases. In the example of FIG. 4, transistor 40 has a gate length of 1.5 and a gate width of 49, while transistor 42 has a gate length of 1.5 and a gate width of 17.

Transistors 40 and 42 receive respective VDD and VSS voltage supplies and provide outputs to a non-linear resistor 44, typically comprising paired N and P transistors 50 and 52 respectively. In the example of FIG. 4, transistor 50 has a gate length of 2.5 and a gate width of 12, while transistor 52 has a gate length of 2.5 and a gate width of 24.5.

The base of transistor 50 receives the OE input, while the base of transistor 52 receives the inverted OE input via an inverter 54. It may thus be appreciated that when the OE input is high, both transistors 50 and 52 conduct.

As seen in FIG. 4, the respective N and P outputs of respective transistors 42 and 40 are supplied in parallel to respective joined terminals of transistors 50 and 52.

P and N transistors 60 and 62 are coupled respectively between the P and N base inputs and the VDD and VSS voltage supply lines. Their respective bases receive the OE input and the inverted OE input respectively.

The remainder of the circuit of FIG. 4 corresponds to that illustrated in FIG. 2 and corresponding reference numerals are employed. It is noted that transistor 20, in one given example, comprises 19 transistors each having a gate length of 1.5 and a gate width of 53.5 and transistor 24 comprises 16 transistors each having a gate length of 1.5 and a gate width of 76.

Generally speaking, the driver transistors are relatively large and fast and multiple transistors are employed. The feedback transistors should be as large as possible subject to space constraints and should be larger than those in the predriver. The resistor element is preferably formed of slow transistors.

The overall operation of the circuitry of FIG. 4 will now be summarized in conjunction with FIG. 6. Presence of the OE, output enable signal (not shown in FIG. 6), enables the buffer to provide an output. In the presence of the OE signal, when D goes positive, i.e. switches to 1, the N base input is fed directly via transistor 42, causing to be driven quickly to 0 and thereby to cause the N transistors 20 to disconnect quickly.

When D goes positive the P base input is driven via the non-linear resistor 44, comprised of transistors 50 and 52, and thus switches more slowly than the N base input. Similarly, when D switches to 0, the P base input is driven directly to 1 while the N base input is driven more slowly via non-linear resistor 44.

Referring more specifically to the structure of non-linear resistor 44, it is seen that when D goes to 1, the VSS voltage is conducted via transistor 42 to the N base input, immediately driving it to zero and is conducted via transistors 50 and 52, more slowly, to the P base input, driving it to zero and causing transistors 20 to immediately disconnect and transistors 24 to more slowly conduct, providing a 1 output at the pad.

Similarly, when D goes to 0, the VDD voltage is conducted via transistor 40 to the P base input, immediately driving it to 1 and is conducted via transistors 50 and 52, more slowly, to the P base input, driving it to 1 and causing transistors 24 to immediately disconnect and transistors 20 to more slowly conduct, providing a 0 output at the pad.

Operation of the driver 12 with the feedback feature provided by the structure of FIG. 2, is substantially as described hereinabove in connection with FIG. 2.

FIGS. 5A and 5B are diagrammatic illustrations of the speed distribution t(n) of a large number n of prior art circuitry (FIG. 5A) and of circuitry constructed and operative in accordance with the present invention. It can be seen that the present invention provides a narrower spread of speeds.

It will be appreciated by persons skilled in the art that the present invention is not limited by what has been particularly shown and described hereinabove. Rather the scope of the present invention is defined only by the claims which follow:

I claim:

1. A controlled slew rate buffer comprising a driver receiving voltage along a voltage supply line, and including feedback apparatus which senses a noise level along the voltage supply line and slows the speed of the buffer when the noise level passes a given threshold, and wherein said driver includes first and second transistors of the same type, the first transistor receiving an input from a first voltage supply and having an output connected to a pad and the second transistor receiving an input from a second voltage supply and having its gate connected to the first voltage supply and its output connected to the gate of the first transistor.

2. A controlled slew rate buffer comprising a driver receiving voltage from a voltage along a voltage supply line, the driver comprising at least one of (1) first and second VSS voltage sources and (2) first and second VDD voltage sources and including feedback apparatus which senses voltage differences between at least one of the first and second voltage sources and slows the speed of the buffer in response to said voltage differences, and wherein said driver includes first and second transistors of the same type, the first transistor receiving an input from a first voltage supply and having an output connected to a pad and the second transistor receiving an input from a second voltage supply and having its gate connected to the first voltage supply and its output connected to the gate of the first transistor.

3. A controlled slew rate buffer according to claim 1 and wherein said first and second transistors are of the N type and control the rate at which the buffer output falls.

4. A controlled slew rate buffer according to claim 2 and wherein said first and second transistors are of the N type and control the rate at which the buffer output falls.

5. A controlled slew rate buffer according to claim 1 and wherein said first and second transistors are of the P type and control the rate at which the buffer output rises.

6. A controlled slew rate buffer according to claim 2 and wherein said first and second transistors are of the P type and control the rate at which the buffer output rises.

7. A controlled slew rate buffer comprising a driver receiving voltage along a voltage supply line, and including feedback apparatus which senses a noise level along the voltage supply line and slows the speed of the buffer when the noise level passes a given threshold and wherein said driver comprises:

first and second transistors of the P type, the first transistor receiving an input from a first voltage supply and having an output connected to a pad and the second transistor receiving an input from a second voltage supply and having its gate connected to the first voltage supply and its output connected to the gate of the first transistor; and third and fourth transistors of the N type, the third transistor receiving an input from a third voltage supply and having an output connected to a pad and the fourth transistor receiving an input from a fourth voltage supply and having its gate connected to the third voltage supply and its output connected to the gate of the third transistor.

8. A controlled slew rate buffer comprising a driver receiving voltage from a voltage along a voltage supply line, the driver comprising at least one of (1) first and second VSS voltage sources and (2) first and second VDD voltage sources and including feedback apparatus which senses voltage differences between at least one of the first and second voltage sources and slows the speed of the buffer in response to said voltage differences, and wherein said driver comprises:

first and second transistors of the P type, the first transistor receiving an input from a first voltage supply and having an output connected to a pad and the second transistor receiving an input from a second voltage supply and having its gate connected to the first voltage supply and its output connected to the gate of the first transistor; and third and fourth transistors of the N type, the third transistor receiving an input from a third voltage supply and having an output connected to a pad and the fourth transistor receiving an input from a fourth voltage supply and having its gate connected to the third voltage supply and its output connected to the gate of the third transistor.

9. A controlled slew rate buffer according to claim 1 and wherein said driver includes first and second N-type transistors and first and second P-type transistors, the first N-type transistor receiving an input from a first VSS voltage supply and the first P-type transistor receiving an input from a first VDD voltage supply, the first N-type and first P-type transistors having a joined output, the first N-type transistor having an N base input and the first P-type transistor having a P base input, the second N-type transistor receiving an input from a second VSS voltage supply and the second P- type transistor receiving an input from a second VDD voltage supply, the base of the second N-type transistor being coupled to the first VSS voltage supply and the base of the second P-type transistor being connected to the first VDD voltage supply, the output of the second N-type transistor being connected to the N base input and the output of the second P-type transistor being connected to the P base input.

10. A controlled slew rate buffer according to claim 2 and wherein said driver includes first and second N-type transistors and first and second P-type transistors, the first N-type transistor receiving an input from a first VSS voltage supply and the first P-type transistor receiving an input from a first VDD voltage supply, the first N-type and first P-type transistors having a joined output, the first N-type transistor having an N base input and the first P-type transistor having a P base input, the second N-type transistor receiving an input from a second VSS voltage supply and the second P-type transistor receiving an input from a second VDD voltage supply, the base of the second N-type transistor being coupled to the first VSS voltage supply and the base of the second P-type transistor being connected to the first VDD voltage supply, the output of the second N-type transistor being connected to the N base input and the output of the second P-type transistor being connected to the P base input.

11. A controlled slew rate buffer comprising a driver receiving voltage along a voltage supply line, and including feedback apparatus which senses a noise level along the voltage supply line and slows the speed of the buffer when the noise level passes a given threshold, and also including a pre-driver comprising a split inverter and a non-linear resistor disposed between the two parts of the inverter.

12. A controlled slew rate buffer comprising a driver receiving voltage from a voltage along a voltage supply line, the driver comprising at least one of (1) first and second VSS voltage sources and (2) first and second VDD voltage sources and including feedback apparatus which senses voltage differences between at least one of the first and second voltage sources and slows the speed of the buffer in response to said voltage differences, and also including a pre-driver comprising a split inverter and a non-linear resistor disposed between the two parts of the inverter.

13. A controlled slew rate buffer according to claim 11 and wherein said pre-driver comprises a P-type transistor and an N-type transistor having respective outputs which provide respective N and P base inputs to the driver, the outputs of the P-type and N-type transistors being separated by a non-linear resistor.

14. A controlled slew rate buffer according to claim 12 and wherein said pre-driver comprises a P-type transistor and an N-type transistor having respective outputs which provide respective N and P base inputs to the driver, the outputs of the P-type and N-type transistors being separated by a non-linear resistor.

* * * * *